(12) United States Patent
Munjal et al.

(10) Patent No.: US 10,139,878 B2
(45) Date of Patent: Nov. 27, 2018

(54) SYSTEMS AND METHODS FOR EXTENDED POWER PERFORMANCE CAPABILITY DISCOVERY FOR A MODULAR CHASSIS

(71) Applicant: Dell Products L.P., Round Rock, TX (US)

(72) Inventors: Ashish Munjal, Round Rock, TX (US); Michael Louis Hobbs, Austin, TX (US); Tracy L. Smith, Del Valle, TX (US); William Fonkou Tambe, Round Rock, TX (US); Sunil A. Vyas, Round Rock, TX (US); Andrey Krokhin, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/215,302

(22) Filed: Mar. 17, 2014

(65) Prior Publication Data

US 2015/0261272 A1    Sep. 17, 2015

(51) Int. Cl.
| | |
|---|---|
| *G06F 1/26* | (2006.01) |
| *H05K 7/14* | (2006.01) |
| *G06F 1/18* | (2006.01) |
| *G06F 11/20* | (2006.01) |
| *G06F 11/30* | (2006.01) |

(52) U.S. Cl.
CPC ............. *G06F 1/263* (2013.01); *G06F 1/189* (2013.01); *G06F 1/26* (2013.01); *G06F 11/2015* (2013.01); *H05K 7/1492* (2013.01); *G06F 11/3031* (2013.01); *G06F 11/3058* (2013.01); *G06F 2201/845* (2013.01)

(58) Field of Classification Search
CPC ........................................................ G06F 1/263
USPC ........................................................ 713/300
See application file for complete search history.

(56) References Cited

U.S. PATENT DOCUMENTS

| | | | | |
|---|---|---|---|---|
| 6,526,515 B1 * | 2/2003 | Charles | ................... | G06F 1/266 713/300 |
| 7,509,506 B2 * | 3/2009 | Bahali | ................... | G06F 1/3203 709/208 |
| 8,751,836 B1 * | 6/2014 | Piszczek | ................ | G06F 1/3268 713/300 |

(Continued)

*Primary Examiner* — Mark A Connolly
(74) *Attorney, Agent, or Firm* — Jackson Walker L.L.P.

(57) ABSTRACT

A chassis may include a plurality of power supply units and a controller. The power supply units may be configured to deliver electrical energy to information handling resources disposed in the chassis. The controller may be communicatively coupled to the power supply units and configured to: receive operational parameters associated with the plurality of power supply units; receive user configuration parameters governing operation of components of the chassis; and based at least on the operational parameters and the user configuration parameters, determine if the controller and the plurality of power supply units are capable of operating in an enhanced power performance mode, wherein when operating in the enhanced power performance mode, one or more power supply units that would otherwise operate as idle redundant power supplies in absence of the enhanced power performance mode are oversubscribed to allocate electrical energy to the information handling resources disposed in the chassis.

12 Claims, 2 Drawing Sheets

(56) References Cited

U.S. PATENT DOCUMENTS

| | | | | |
|---|---|---|---|---|
| 9,041,250 B1* | 5/2015 | Czamara | .................. | H02J 3/14 |
| | | | | 307/64 |
| 2003/0065958 A1* | 4/2003 | Hansen | .................... | G06F 1/26 |
| | | | | 713/300 |
| 2007/0118771 A1* | 5/2007 | Bolan | .................... | G06F 1/263 |
| | | | | 713/300 |
| 2007/0150757 A1* | 6/2007 | Aldereguia | ........... | G06F 1/3209 |
| | | | | 713/300 |
| 2012/0243160 A1* | 9/2012 | Nguyen | ................. | G06F 1/181 |
| | | | | 361/679.08 |
| 2014/0208129 A1* | 7/2014 | Morales | ................... | H02J 9/00 |
| | | | | 713/300 |
| 2015/0115711 A1* | 4/2015 | Kouroussis | ............ | H02J 9/061 |
| | | | | 307/23 |

\* cited by examiner

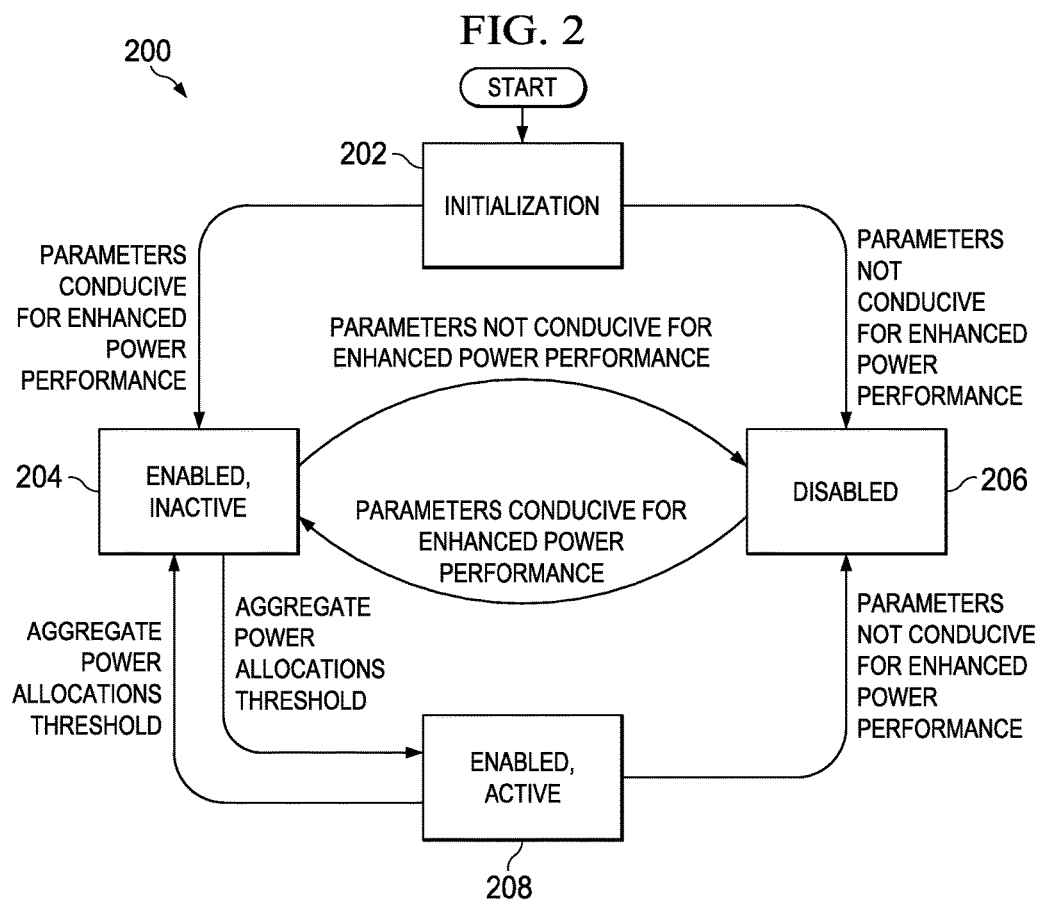

SYSTEMS AND METHODS FOR EXTENDED POWER PERFORMANCE CAPABILITY DISCOVERY FOR A MODULAR CHASSIS

TECHNICAL FIELD

The present disclosure relates in general to information handling systems, and more particularly to discovering capability of information handling resources of a modular chassis for operating in an extended power performance mode.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Power supplies are used in information handling systems to provide electrical energy to an information handling system and the various information handling resources thereof. In many applications, power supplies convert alternating current (AC) electrical energy (e.g., from a public power grid) to direct current (DC) electrical energy, and deliver the DC electrical energy to information handling resources via suitable electrical conductors (e.g., one or more power buses coupling information handling resources to the power supplies).

In many implementations, power supplies are capable of being provided in a redundant configuration. For example, power demands of an information handling system (or a collection of a plurality of information handling systems) may require an amount of power significantly less than that of the capacity of the available power supplies. Nonetheless, to ensure adequate power is provided in the event of a failure of an individual power supply, a particular number of power supplies may be enabled (e.g., made "active") so as to provide a desired level of redundancy, despite the fact that the aggregate capacity of the enabled power supplies may be well in excess of that required to satisfy the power requirements of a system.

One downside of providing redundancy in a modular server system configured to receive one or more modular information handling systems is that a portion of the available power of the power supplies is not used. However, in some instances, such unused power could possibly be used to increase performance of the information handling systems and other information handling resources of the server system. Accordingly, it may be desirable to enable a mode of operation, known as an extended power performance mode, allowing power supplies used for redundancy to allow for oversubscription, such that power capacity of such redundant power supplies may be used to increase performance.

SUMMARY

In accordance with the teachings of the present disclosure, the disadvantages and problems associated with reporting air mover events have been reduced or eliminated.

In accordance with embodiments of the present disclosure, a chassis may include a plurality of power supply units and a controller. The plurality of power supply units may be configured to deliver electrical energy to information handling resources disposed in the chassis. The controller may be communicatively coupled to the power supply units and configured to: receive operational parameters associated with the plurality of power supply units; receive user configuration parameters governing operation of components of the chassis; and based at least on the operational parameters and the user configuration parameters, determine if the controller and the plurality of power supply units are capable of operating in an enhanced power performance mode, wherein when operating in the enhanced power performance mode, one or more power supply units that would otherwise operate as idle redundant power supplies in absence of the enhanced power performance mode are oversubscribed to allocate electrical energy to the information handling resources disposed in the chassis.

In accordance with these and other embodiments of the present disclosure, a method may include, in a chassis having a plurality of power supply units configured to deliver electrical energy to information handling resources disposed in the chassis, receiving operational parameters associated with the plurality of power supply units. The method may also include receiving user configuration parameters governing operation of components of the chassis. The method may further include, based at least on the operational parameters and the user configuration parameters, determining if a controller and the plurality of power supply units are capable of operating in an enhanced power performance mode, wherein when operating in the enhanced power performance mode, one or more power supply units that would otherwise operate as idle redundant power supplies in absence of the enhanced power performance mode are oversubscribed to allocate electrical energy to the information handling resources disposed in the chassis.

In accordance with these and other embodiments of the present disclosure, an article of manufacture may include a non-transitory computer readable medium and computer-executable instructions carried on the computer readable medium. The instructions may be readable by a processor, and may be configured to, when read and executed, cause the processor to, in a chassis having a plurality of power supply units configured to deliver electrical energy to one or more modules received by the chassis: receive operational parameters associated with the plurality of power supply units; receive user configuration parameters governing operation of components of the chassis; and based at least on the operational parameters and the user configuration parameters, determine if a controller and the plurality of power supply units are capable of operating in an enhanced power performance mode, wherein when operating in the enhanced power performance mode, one or more power supply units that would otherwise operate as idle redundant power supplies in absence of the enhanced power performance mode are oversubscribed to allocate electrical energy to the information handling resources disposed in the chassis.

Technical advantages of the present disclosure will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 2 illustrates various states of a state machine that may be maintained by a chassis management controller of the chassis illustrated in FIG. 1, in accordance with embodiments of the present disclosure.

DETAILED DESCRIPTION

Figure 1:
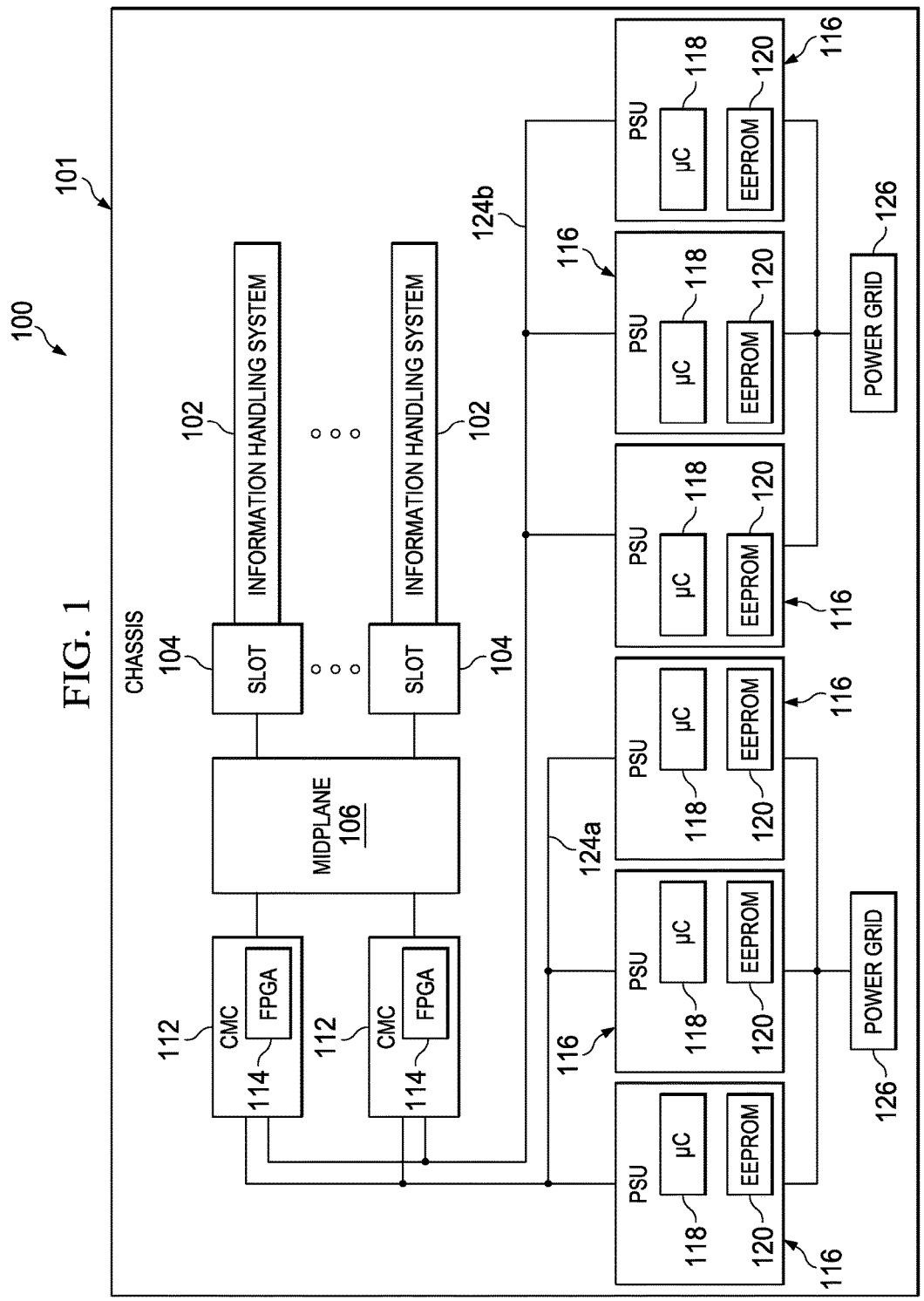
FIG. 1 illustrates a block diagram of an example system chassis with multiple information handling systems and with various peripheral and I/O capabilities common to the chassis as a whole, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, I/O devices and/or interfaces, storage resources, network interfaces, motherboards, electro-mechanical devices (e.g., fans), displays, and power supplies.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory ("RAM"), read-only memory ("ROM"), electrically erasable programmable read-only memory ("EEPROM"), and/or flash memory; as well as communications media such as wires, optical fibers, microwaves, radio waves, and other electromagnetic and/or optical carriers; and/or any combination of the foregoing.

FIG. 1 illustrates a block diagram of an example system 100 having a chassis 101 with multiple information handling systems 102 and with various peripheral and I/O capabilities common to chassis 101 as a whole, in accordance with embodiments of the present disclosure. As depicted in FIG. 1, system 100 may comprise a chassis 101 including a plurality of slots for receiving information handling systems 102, a midplane 106, a plurality of chassis management controllers (CMCs) 112, a plurality of power supply units (PSUs) 116, a plurality of buses 124 (e.g., bus 124a, bus 124b), and a plurality of power grids 126.

As shown in FIG. 1, chassis 101 may include a plurality of slots 104, each slot configured to receive therein a modular information handling system 102. Accordingly, each slot 104 may be communicatively coupled to midplane 106, thus allowing communication of data to and from an information handling system 102 and other information handling resources of chassis 101 via a slot 104 corresponding to the information handling system 102 and midplane 106.

An information handling system 102 may generally be operable to receive data from and/or communicate data to one or more other information handling resources of chassis 101 via midplane 106. In certain embodiments, an information handling system 102 may be a server. In such embodiments, an information handling system may comprise a blade server having modular physical design. In these and other embodiments, an information handling system 102 may comprise an M class server.

Each chassis management controller (CMC) 112 may be communicatively coupled to midplane 106 and may comprise any system, device, or apparatus configured to facilitate management and/or control of components of chassis 101, information handling systems modularly coupled within, and/or one or more of its component information handling resources. Each CMC 112 may be configured to issue commands and/or other signals to manage and/or control information handling systems coupled to slots 104 and/or information handling resources of chassis 101. Each CMC 112 may comprise a microprocessor, microcontroller, DSP, ASIC, field programmable gate array ("FPGA"), EEPROM, or any combination thereof. For example, as shown in the embodiments represented by FIG. 1, each CMC 112 may include an associated FPGA 114, which may comprise firmware, logic, and/or data for controlling functionality of its associated CMC 112. In the embodiments represented by FIG. 1, a plurality of CMCs 112 may be present in chassis 101, thus permitting redundancy of CMC functionality in the event of a failure or removal of one CMC 112.

In addition or alternatively, a CMC 112 may also provide a management console for user/administrator access to these functions. For example, a CMC 112 may provide for communication with a user interface, permitting a user to interact with the CMC 112 and configure control and management of components of chassis 101 by a CMC 112. As another example, a CMC 112 may implement Web Services Management ("WS-MAN") or another suitable management protocol permitting a user to remotely access a CMC 112 to configure chassis 101 and its various information handling resources. In such embodiments, a CMC 112 may interface with a network interface separate from a traditional network interface of chassis 101, thus allowing for "out-of-band" control of chassis 101, such that communications to and from a CMC 112 are communicated via a management channel physically isolated from an "in band" communication channel with the traditional network interface. Thus, for example, if a failure occurs in chassis 101 that prevents an administrator from interfacing with chassis 101 via a traditional network interface and/or a user interface (e.g., operating system failure, power failure, etc.), the administrator may still be able to monitor and/or manage chassis 101 (e.g., to diagnose problems that may have caused failure) via a CMC 112. In the same or alternative embodiments, a CMC 112 may allow an administrator to remotely manage one or more parameters associated with operation of chassis 101 and its various information handling resources (e.g., power usage, processor allocation, memory allocation, security privileges, etc.).

Each CMC 112 may also store or maintain operational parameters for power management of chassis 101, including whether enhanced power performance is enabled, whether CMC firmware is capable of performing enhanced power performance, a power policy, a power redundancy policy and/or other parameters.

Each of PSUs 116 may include any device, system, or apparatus operable to supply power or electrical energy to one or more components of chassis 101. For example, one or more PSUs 116 include any system, device, and/or apparatus operable to supply direct current (DC) electrical power to one or more components of chassis 101. DC power sources may include a battery and/or an AC/DC adapter that may convert 120- or 240-volt (or any other suitable voltage) alternating current supplied by a utility company to a regulated lower voltage DC power source. In addition, an AC/DC adapter may also charge a battery while supplying power to chassis 101.

In addition or alternatively, one or more PSUs 116 may include any system, device, and/or apparatus operable to supply AC electrical power directly to one or more components of chassis 101. In some embodiments, the delivered AC power may subsequently be converted into a DC power source (e.g., using an AC/DC converter).

In some embodiments, one or more of PSUs 116 may include uninterruptible power sources and/or switch mode power sources internal to or externally coupled to chassis 101. In some embodiments, PSUs 116 may be assembled in a redundant configuration within chassis 101 (e.g., one or more power sources may be configured to share a load current such that failure of a single power source may not substantially affect the load current). Each PSU 116 may comprise a microprocessor, microcontroller, DSP, ASIC, FPGA, EEPROM, or any combination thereof. For example, as shown in the embodiments represented by FIG. 1, each PSU 116 may include microcontroller 118 and EEPROM 120, which may comprise firmware, logic, and/or data for controlling functionality of such PSU 116. One or both of microcontroller 118 and EEPROM 120 may also store or maintain operational parameters associated with a corresponding PSU 116, including whether such PSU 116 is capable to perform extended power performance, whether such PSU 116 is available for power oversubscription, whether the PSU 116 is online, the health status of the PSU 116 (e.g., input alternating current and output direct current are operating correctly), and/or other parameters.

A bus 124 may comprise a communication bus and/or other suitable communication path (e.g., a Power Management Bus or PMBus) that facilitates communication of control signals and/or data between CMCs 112 and PSUs 116. For example, in some embodiments, a CMC 112 may communicate control signals via an associated bus 124 to one or more of PSUs 116 in order to control such PSUs 116 (e.g., to selectively enable or disable individual PSUs 116). In the same or alternative embodiments, PSUs 116 may communicate via an associated bus 124 to CMC 112 data regarding operation of PSUs 116 (e.g., the operational parameters associated with PSUs 116 enumerated above).

A power grid 126 may comprise any suitable system for conveying electrical energy generated by PSUs 116 to information handling resources of chassis 101. For purposes of clarity and exposition, electrical coupling of power grid 126 to information handling resources is not shown. In embodiments of the present disclosure, a plurality of power grids 126 may be configured to operate in a redundant manner, such that in the event of a failure of active power grid 126 or a failure of one or more PSUs 116 supplying electrical energy to such active power grid 126, information handling resources of chassis 101 could failover to a redundant power grid 126. To support such redundancy, different PSUs 116 may supply electrical energy to different power grids 126 (e.g., as shown in FIG. 1, a portion of PSUs 116 may supply electrical energy to one power grid 126, and another portion of PSUs 116 may supply electrical energy to another power grid 126).

In operation, a CMC 112 may dynamically determine if an enhanced power performance mode for chassis 101 is to be activated and deactivated by monitoring a plurality of parameters concerning the CMC 112 and PSUs 116, as well as user-defined settings related to enhanced power performance. This functionality of CMCs 112 may be better illustrated in reference to FIG. 2.

FIG. 2 illustrates various states 202-208 of a state machine 200 that may be maintained by a CMC 112, in accordance with embodiments of the present disclosure. In some embodiments, the functionality of CMCs 112 for carrying out execution of state machine 200 may be performed by a program of instructions executed on the CMCs 112 (e.g., logic embodied in FPGAs 114).

At an initialization state 202, a CMC 112 may retrieve operating parameters associated with PSUs 116 (e.g., via buses 124), user configuration parameters for chassis 101 (e.g., which may be stored in FPGA 114 or other computer-readable media accessible to the CMC 112), other parameters regarding the operation of chassis 101, and/or other parameters regarding the enhanced power performance capabilities of information handling resources of chassis 101. Based on analysis of the retrieved parameters, the CMC 112 may determine if chassis 101 is capable of enhanced power performance. For example, the CMC 112 may determine chassis 101 is capable of enhanced power performance if operating parameters of PSUs 116 indicate that PSUs 116 are capable of operating in enhanced power performance mode and if the user configuration parameters permit the CMC 112 to operate in enhanced power performance mode.

As a specific example, the CMC 112 may determine that the operating parameters of PSUs 116 indicate that PSUs 116 are capable of operating in enhanced power performance mode where a sufficient number of PSUs 116 communicate (e.g., in response to one or more queries from the CMC 112) indications to CMC 112 that a sufficient number of PSUs 116 are active, online, have firmware capable of operating in enhanced power performance mode, are operating without faults (e.g., no errors in alternating current input, direct current output, or associated power grids 126), and are capable of over-subscription. Such indications may be communicated in accordance with a plurality of parameters stored in either or both of microcontroller 118 and EEPROM 120 associated with a given PSU 116. In addition, the available amount of oversubscription of the PSUs 116 may be communicated via buses 124 to the CMC 112 (e.g., from microcontroller 118 in response to a query from the CMC 112).

As another specific example, a CMC 112 may determine that it is capable of operating in enhanced power performance mode if various user configuration parameters (e.g., enhanced power performance user enabled, power policy, power redundancy policy, dynamic power supply engagement, max power conservation mode, server performance over power redundancy mode, server-based power management, fresh air configuration, etc.) are suitable for operation in enhanced power performance mode. In addition or alternatively, the CMC 112 may determine that it is capable of operating in enhanced power performance mode if CMC firmware is enabled for enhanced power performance.

If, based on analysis of the various operating and user configuration parameters, the CMC 112 determines that chassis 101 is capable of enhanced power performance, state machine 200 may proceed to state 204. Otherwise, state machine 200 may proceed to state 206.

In state 204, enhanced power performance mode may be enabled but inactive. In such state, a CMC 112 may continue to monitor operating and configuration parameters indicating whether or not chassis 101 is capable of enhanced power performance. If, during such monitoring, any such parameters change such that chassis 101 is no longer capable of enhanced power performance, state machine 200 may proceed to state 206. Such change in parameters could arise from a user configuration modification, failure of a power grid 126, removal of a PSU 116, or a fault of a PSU 116 (e.g., loss of input power or output power of a PSU 116). While in state 204, a CMC 112 may also monitor the aggregate amount of power allocated to information handling systems 102 and information handling resources of chassis 101. If such aggregate power allocation exceeds a predetermined threshold (e.g., user-configured or automatically set by the CMC 112) while chassis 101 remains capable of enhanced power performance, state machine 200 may proceed to state 208.

In state 206, enhanced power performance mode may be disabled. In such state, a CMC 112 may continue to monitor operating and configuration parameters indicating whether or not chassis 101 is capable of enhanced power performance. If, during such monitoring, any such parameters change such that chassis 101 is then capable of enhanced power performance, state machine 200 may proceed to state 204. Such change in parameters could arise from a user configuration modification, recovery of a power grid 126, insertion of a PSU 116, and/or a recovery of a fault of a PSU 116 (e.g., recovery of input power or output power of a PSU 116).

In state 208, enhanced power performance mode may be enabled and active, and as such, PSUs 116 that would otherwise be idle in the absence of extended power performance may instead provide electrical energy to information handling systems 102 and/or information handling resources of chassis 101 in accordance with the aggregate power allocation within chassis 101 and as limited by the available oversubscription reported by such PSUs 116. In such state, a CMC 112 may continue to monitor operating and configuration parameters indicating whether or not chassis 101 is capable of enhanced power performance. If, during such monitoring, any such parameters change such that chassis 101 is no longer capable of enhanced power performance, state machine 200 may proceed to state 206. Such change in parameters could arise from a user configuration modification, failure of a power grid 126, removal of a PSU 116, or a fault of a PSU 116 (e.g., loss of input power or output power of a PSU 116). While in state 208, a CMC 112 may also monitor the aggregate amount of power allocated to information handling systems 102 and information handling resources of chassis 101. If such aggregate power allocation falls below a predetermined threshold (e.g., user-configured or automatically set by CMC 112) while chassis 101 remains capable of enhanced power performance, state machine 200 may proceed to state 204.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A chassis comprising:
   a plurality of power supply units, configured to deliver electrical energy via a power grid to information handling resources disposed in the chassis, the power supply units comprising first power supply units configured to deliver electrical energy via a first grid and second power supply units configured to deliver, responsive to a failure of the first grid, electrical energy to the information handling resources via a redundant grid; and
   a chassis management controller communicatively coupled to the first power supply units via a first bus, communicatively coupled to the second power supply units via a second bus, and configured to perform operations comprising:
   sending one or more queries to the plurality of power supply units, wherein each query is associated with a corresponding power supply operational parameter;
   receiving, from at least some of the plurality of power supply units, one or more responses to the one or more queries, wherein each of the one or more responses indicates a present state of a corresponding power supply operational parameter;
   receiving user configuration parameters governing operation of chassis components;

analyzing the one or more responses indicating a present state of a corresponding power supply operational parameter and the user configuration parameters to determine whether enhanced power performance mode operation is indicated;

responsive to determining that enhanced power performance mode operation is not indicated, operating a particular power supply unit as an idle redundant power supply;

responsive to determining that enhanced power performance mode operation is indicated, determining if an aggregate power allocation to the information handling resources exceeds a threshold power; and responsive to determining that the aggregate power allocation to the information handling resources exceeds a threshold power, operating the particular power supply unit in an enhanced power performance mode, wherein the particular power supply unit is oversubscribed to provide power to the information handling resources disposed in the chassis; and wherein a particular power supply operational parameter comprises an oversubscription threshold for each of the plurality of power supply units, and further wherein when the particular power supply is operating in the enhanced power performance mode, and wherein the operations include:

allocating power to the particular power supply unit in accordance with the oversubscription threshold.

2. The chassis of claim 1, wherein the operations include:
repeatedly monitoring and analyzing the responses indicating a present state of a corresponding power supply operational parameter and the user configuration parameters and, in response to such detecting a change in whether enhanced power performance mode performance is indicated, operating the particular power supply unit in accordance with the change.

3. The chassis of claim 1, wherein the operations include:
receiving an indication of enhanced power performance mode firmware executable by the chassis management controller; and based at least on the one or more responses indicating a corresponding power supply operational parameter, the user configuration parameters, and the indication of the enhanced power performance mode firmware, determining the indication of enhanced power performance mode operation.

4. The chassis of claim 1, wherein the chassis management controller comprises a first chassis management controller, the chassis further comprising:
a redundant chassis management controller communicatively coupled to:
the first power supply units via the first bus;
the second power supply units via the second bus; and
the first chassis management controller via the first bus and the second bus;
wherein the redundant chassis management controller is configured to function as the first chassis management controller responsive to a failure of the first chassis management controller.

5. The chassis of claim 1, wherein:
when the first grid is functional, the particular power supply unit comprises one of the first power supply units; and
when the first grid is failed, the particular power supply unit comprises one of the second power supply units.

6. The chassis of claim 1, wherein:
when the first grid is functional, the particular power supply unit comprises one of the second power supply units.

7. A method comprising:
sending one or more queries to a plurality of power supply units, wherein each query is associated with a corresponding power supply operational parameter;

receiving, from at least some of the plurality of power supply units, one or more responses to the one or more queries, wherein each of the one or more responses indicates a present state of a corresponding power supply operational parameter;

receiving user configuration parameters governing operation of chassis components;

analyzing the one or more responses indicating a present state of a corresponding power supply operational parameter present and the user configuration parameters to determine whether enhanced power performance mode operation is indicated;

responsive to determining that enhanced power performance mode operation is not indicated, operating a particular power supply unit as an idle redundant power supply;

responsive to determining that enhanced power performance mode operation is indicated, determining if an aggregate power allocation to the information handling resources exceeds a threshold power;

responsive to determining that the aggregate power allocation to the information handling resources exceeds a threshold power, operating the particular power supply unit in an enhanced power performance mode, wherein the particular power supply unit is oversubscribed to provide power to the information handling resources disposed in the chassis;

wherein a particular power supply operational parameter comprises an oversubscription threshold for each of the plurality of power supply units, and further wherein the particular power supply is operating in the enhanced power performance mode, and wherein the operations include:

allocating power to the particular power supply unit in accordance with the oversubscription threshold.

8. The method of claim 7, further comprising:
monitoring for a change in the indication of enhanced power performance mode operation and in response to such change, operating the particular power supply unit in accordance with the change.

9. The method claim 7, further comprising:
receiving an indication of enhanced power performance firmware, executable by the chassis management controller;

based at least on the one or more responses indicating a corresponding power supply operational parameter, the user configuration parameters, and the indication of enhanced power performance firmware executable by the chassis management controller, determining the indication of enhanced power performance mode performance.

10. An article of manufacture comprising:
a non-transitory computer readable medium; and
computer-executable instructions carried on the computer readable medium, the instructions readable by a processor in a chassis having a plurality of power supply units including first power supply units configured to deliver electrical energy via a first power grid to modules received by the chassis and second power supply units configured to deliver electrical energy via a redundant power grid to the modules responsive to a first grid failure, wherein the instructions, when executed by the processor cause the processor to perform operations comprising:

sending one or more queries to the plurality of power supply units, wherein each query is associated with a corresponding power supply operational parameter;

receiving, from at least some of the plurality of power supply units, one or more responses to the one or more queries, wherein each of the one or more responses indicates a present state of a corresponding power supply operational parameter;

receiving user configuration parameters governing operation of chassis components;

analyzing the one or more responses indicating a present state of a corresponding power supply operational parameter and the user configuration parameters to determine whether enhanced power performance mode operation is indicated;

responsive to determining that enhanced power performance mode operation is not indicated, operating a particular power supply unit as an idle redundant power supply;

responsive to determining that enhanced power performance mode operation is indicated, determining if an aggregate power allocation to the information handling resources exceeds a threshold power;

responsive to determining that the aggregate power allocation to the information handling resources exceeds a threshold power, operating the particular power supply unit in an enhanced power performance mode, wherein the particular power supply unit is oversubscribed to provide power to the information handling resources disposed in the chassis;

wherein a particular power supply operational parameter comprises an oversubscription threshold for each of the plurality of power supply units, and further wherein the particular power supply is operating in the enhanced power performance mode, and wherein the operations include:

allocating power to the particular power supply unit in accordance with the oversubscription threshold.

11. The article of claim 10, wherein the operations include:

monitoring for a change in the indication of enhanced power performance mode operation and in response to such change, operating the particular power supply unit in accordance with the change.

12. The article of claim 10, wherein the operations include:

receiving an indication of enhanced power performance firmware executable by the chassis management controller; and based at least on the one or more responses indicating a corresponding power supply operational parameters, the user configuration parameters, and the indication of enhanced power performance firmware, determine the indication of enhanced power performance mode operation.

* * * * *